United States Patent
Ockenfuss

(10) Patent No.: US 11,450,698 B2
(45) Date of Patent: Sep. 20, 2022

(54) DIELECTRIC MIRROR BASED MULTISPECTRAL FILTER ARRAY

(71) Applicant: VIAVI Solutions Inc., San Jose, CA (US)

(72) Inventor: Georg J. Ockenfuss, Santa Rosa, CA (US)

(73) Assignee: VIAVI Solutions Inc., San Jose, CA (US)

(*) Notice: Subject to any disclaimer, the term of this patent is extended or adjusted under 35 U.S.C. 154(b) by 0 days.

(21) Appl. No.: 15/964,395

(22) Filed: Apr. 27, 2018

(65) Prior Publication Data

US 2018/0247965 A1    Aug. 30, 2018

Related U.S. Application Data

(63) Continuation of application No. 15/388,543, filed on Dec. 22, 2016, now Pat. No. 9,960,199.

(Continued)

(51) Int. Cl.
*H01L 27/146* (2006.01)
*G01J 3/26* (2006.01)
(Continued)

(52) U.S. Cl.
CPC .......... *H01L 27/14621* (2013.01); *G01J 3/26* (2013.01); *G01J 3/2803* (2013.01);
(Continued)

(58) Field of Classification Search
CPC ......... H01L 27/14621; H01L 27/14685; H01L 27/14625; H01L 51/5265; H01L 27/14629;
(Continued)

(56) References Cited

U.S. PATENT DOCUMENTS

| 3,442,572 A | 5/1969 | Illsley et al. |
| 3,530,824 A | 11/1970 | Illsley et al. |

(Continued)

FOREIGN PATENT DOCUMENTS

| CN | 1442677 A | 9/2003 |
| CN | 1546956 A | 11/2004 |

(Continued)

OTHER PUBLICATIONS

Ferreira et al., "Narrow-band pass filter array for integrated opto-electronic spectroscopy detectors to assess esophageal tissue", Biomed Opt. Exp. 2, http://www.ncbi.nlm.nih.gov/pmc/articles/PMC3114235/, Jun. 1, 2011, 12 pages.

(Continued)

*Primary Examiner* — Stephen M Bradley
(74) *Attorney, Agent, or Firm* — Harrity & Harrity, LLP

(57) ABSTRACT

An optical sensor device may include a set of optical sensors. The optical sensor device may include a substrate. The optical sensor device may include a multispectral filter array disposed on the substrate. The multispectral filter array may include a first dielectric mirror disposed on the substrate. The multispectral filter array may include a spacer disposed on the first dielectric mirror. The spacer may include a set of layers. The multispectral filter array may include a second dielectric mirror disposed on the spacer. The second dielectric mirror may be aligned with two or more sensor elements of a set of sensor elements.

20 Claims, 12 Drawing Sheets

Related U.S. Application Data

(60) Provisional application No. 62/272,086, filed on Dec. 29, 2015, provisional application No. 62/294,970, filed on Feb. 12, 2016.

(51) Int. Cl.
  *G01J 3/28* (2006.01)
  *G01J 3/36* (2006.01)
  *G02B 5/28* (2006.01)
  *H01L 51/52* (2006.01)
  *H01L 27/148* (2006.01)

(52) U.S. Cl.
  CPC .............. *G01J 3/36* (2013.01); *G02B 5/285* (2013.01); *H01L 27/14625* (2013.01); *H01L 27/14629* (2013.01); *H01L 27/14645* (2013.01); *H01L 27/14649* (2013.01); *H01L 27/14685* (2013.01); *H01L 27/14868* (2013.01); *H01L 27/14875* (2013.01); *H01L 51/5265* (2013.01); *G01J 2003/2806* (2013.01); *G01J 2003/2826* (2013.01)

(58) Field of Classification Search
  CPC ............. G01J 3/2803; G01J 2003/2806; G01J 2003/2816
  See application file for complete search history.

(56) References Cited

U.S. PATENT DOCUMENTS

| | | |
|---|---|---|
| 3,617,331 A | 11/1971 | Illsley et al. |
| 4,547,074 A | 10/1985 | Hinoda et al. |
| 4,756,602 A | 7/1988 | Southwell et al. |
| 4,822,998 A * | 4/1989 | Yokota ..................... G01J 3/26 250/226 |
| 4,957,371 A | 9/1990 | Pellicori et al. |
| 5,144,498 A | 9/1992 | Vincent |
| 5,246,803 A | 9/1993 | Hanrahan et al. |
| 5,337,191 A | 8/1994 | Austin et al. |
| 5,680,188 A | 10/1997 | Yoshida et al. |
| 5,784,507 A | 6/1998 | Holm-Kennedy |
| 5,872,655 A | 2/1999 | Seddon et al. |
| 5,905,571 A | 5/1999 | Butler et al. |
| 5,986,808 A | 11/1999 | Wang |
| 6,163,363 A | 12/2000 | Nelson et al. |
| 6,215,802 B1 | 4/2001 | Lunt |
| 6,297,907 B1 | 10/2001 | Wang |
| 6,465,105 B1 | 10/2002 | Johnson et al. |
| 6,574,490 B2 | 6/2003 | Abbink et al. |
| 6,611,636 B2 | 8/2003 | Deliwala |
| 6,631,033 B1 | 10/2003 | Lewis et al. |
| 6,638,668 B2 | 10/2003 | Buchsbaum et al. |
| 6,841,238 B2 | 1/2005 | Argoitia et al. |
| 6,850,366 B2 | 2/2005 | Hendrix et al. |
| 6,891,685 B2 | 5/2005 | Deliwala et al. |
| 6,912,330 B2 | 6/2005 | Deliwala et al. |
| 7,002,697 B2 | 2/2006 | Domash et al. |
| 7,006,292 B2 | 2/2006 | Hendrix et al. |
| 7,133,197 B2 | 11/2006 | Ockenfuss et al. |
| 7,378,346 B2 | 5/2008 | Le et al. |
| 7,456,383 B2 | 11/2008 | Kim et al. |
| 7,521,666 B2 | 4/2009 | Tsang |
| 7,576,860 B2 | 8/2009 | Wu et al. |
| 7,759,679 B2 | 7/2010 | Inaba et al. |
| 7,907,340 B2 | 3/2011 | Wang et al. |
| 8,031,336 B2 | 10/2011 | Shibayama et al. |
| 8,084,728 B2 | 12/2011 | Tsang |
| 8,163,144 B2 | 4/2012 | Tilsch et al. |
| 8,227,883 B2 * | 7/2012 | Kasano ................... G02B 5/282 257/432 |
| 8,274,739 B2 | 9/2012 | Lee et al. |
| 8,284,401 B2 | 10/2012 | Choi et al. |
| 8,411,269 B2 | 4/2013 | Shibayama et al. |
| 8,480,865 B2 | 7/2013 | Ockenfuss et al. |
| 8,542,359 B2 | 9/2013 | Choi et al. |
| 8,559,113 B2 * | 10/2013 | Wehner .................. G02B 5/201 359/891 |
| 8,675,280 B2 * | 3/2014 | Grand ............... H01L 27/14621 359/587 |
| 8,715,443 B2 * | 5/2014 | Shibayama .............. G01J 3/26 156/247 |
| 8,879,152 B2 | 11/2014 | Junger et al. |
| 8,896,839 B2 | 11/2014 | Saptari |
| 9,291,504 B2 | 3/2016 | Goldring et al. |
| 9,304,039 B2 | 4/2016 | Tack et al. |
| 9,366,573 B2 | 6/2016 | Geelen et al. |
| 9,383,258 B2 | 7/2016 | Goldring et al. |
| 9,630,368 B2 * | 4/2017 | Wehner ........... B29D 11/00634 |
| 9,960,199 B2 * | 5/2018 | Ockenfuss ........ H01L 27/14621 |
| 10,651,216 B2 * | 5/2020 | Ockenfuss .............. H01L 33/46 |
| 11,114,485 B2 | 9/2021 | Ockenfuss |
| 2003/0040175 A1 | 2/2003 | Deliwala |
| 2003/0087121 A1 | 5/2003 | Domash et al. |
| 2005/0123243 A1 | 6/2005 | Steckl et al. |
| 2005/0236653 A1 | 10/2005 | Lim |
| 2007/0039925 A1 | 2/2007 | Swedek et al. |
| 2007/0058182 A1 | 3/2007 | Huibers |
| 2007/0247716 A1 | 10/2007 | Kim et al. |
| 2007/0285539 A1 | 12/2007 | Shimizu |
| 2008/0231957 A1 | 9/2008 | Terayama |
| 2008/0251873 A1 * | 10/2008 | Kasano ............ H01L 27/14632 257/432 |
| 2009/0009621 A1 * | 1/2009 | Yamaguchi ............... H04N 5/33 348/222.1 |
| 2009/0273046 A1 | 11/2009 | Inaba |
| 2009/0302407 A1 | 12/2009 | Gidon et al. |
| 2009/0321865 A1 * | 12/2009 | Kasano .................. G02B 5/201 257/432 |
| 2011/0019380 A1 | 1/2011 | Miles |
| 2011/0228151 A1 * | 9/2011 | Inomata ............ H01L 27/14632 348/294 |
| 2011/0261365 A1 * | 10/2011 | Tisserand .................. G01J 3/26 356/451 |
| 2011/0299104 A1 | 12/2011 | Seo et al. |
| 2012/0044491 A1 | 2/2012 | Urushidani et al. |
| 2012/0085944 A1 * | 4/2012 | Gidon ............... H01L 27/14621 250/553 |
| 2012/0129269 A1 | 5/2012 | Choi et al. |
| 2012/0212467 A1 | 8/2012 | Kohtoku |
| 2012/0327248 A1 | 12/2012 | Tack et al. |
| 2013/0107246 A1 | 5/2013 | Yang |
| 2013/0240708 A1 | 9/2013 | Kokubun |
| 2014/0014838 A1 | 1/2014 | Hendrix et al. |
| 2014/0076716 A1 | 3/2014 | Gorokhovsky et al. |
| 2014/0168761 A1 | 6/2014 | Ockenfuss et al. |
| 2014/0175265 A1 | 6/2014 | Gonzalez et al. |
| 2014/0210031 A1 | 7/2014 | Hendrix et al. |
| 2014/0217625 A1 * | 8/2014 | Hazart .................. G02B 5/201 264/1.7 |
| 2014/0267849 A1 | 10/2014 | Geelen et al. |
| 2014/0267878 A1 | 10/2014 | Geelen et al. |
| 2014/0295610 A1 | 10/2014 | Nakamura et al. |
| 2014/0313342 A1 | 10/2014 | Gan et al. |
| 2014/0320611 A1 | 10/2014 | Choi |
| 2015/0036138 A1 | 2/2015 | Watson et al. |
| 2015/0062420 A1 | 3/2015 | Borthakur et al. |
| 2015/0103354 A1 | 4/2015 | Saptari |
| 2015/0138640 A1 | 5/2015 | Matsushita |
| 2015/0144770 A1 | 5/2015 | Choi |
| 2015/0214261 A1 | 7/2015 | Park et al. |
| 2015/0233762 A1 | 8/2015 | Goldring et al. |
| 2015/0276478 A1 | 10/2015 | Geelen et al. |
| 2015/0286059 A1 | 10/2015 | Yun et al. |
| 2015/0300879 A1 | 10/2015 | Goldring et al. |
| 2015/0369663 A1 | 12/2015 | Margalit et al. |
| 2015/0369980 A1 | 12/2015 | Ockenfuss et al. |
| 2016/0027830 A1 | 1/2016 | Hirano et al. |
| 2016/0120410 A1 | 5/2016 | Kim |
| 2016/0123808 A1 | 5/2016 | Obermueller |
| 2016/0238759 A1 | 8/2016 | Sprague et al. |

(56) References Cited

U.S. PATENT DOCUMENTS

| | | | |
|---|---|---|---|
| 2016/0245697 | A1 | 8/2016 | Shibayama et al. |
| 2017/0005132 | A1 | 1/2017 | Vereecke |

FOREIGN PATENT DOCUMENTS

| | | | |
|---|---|---|---|
| CN | 101211946 A | | 7/2008 |
| CN | 102741671 A | | 10/2012 |
| CN | 102798918 A | | 11/2012 |
| CN | 102804005 A | | 11/2012 |
| EP | 1 801 553 | | 6/2007 |
| JP | S62267624 A | | 11/1987 |
| JP | S6342429 A | | 2/1988 |
| JP | H1062247 A | | 3/1998 |
| JP | 2000031510 A | | 1/2000 |
| JP | 2005107010 A | | 4/2005 |
| JP | 2007019143 A | | 1/2007 |
| JP | 2007514961 A | | 6/2007 |
| JP | 2008233622 A | | 10/2008 |
| JP | 2009545150 A | | 12/2009 |
| JP | 2011198853 A | | 10/2011 |
| JP | 2012042584 A | | 3/2012 |
| JP | 2012511709 A | | 5/2012 |
| JP | 2013512445 A | | 4/2013 |
| JP | 2013190580 A | | 9/2013 |
| KR | 20140079726 A | | 6/2014 |
| WO | 2005036240 A1 | | 4/2005 |
| WO | 2005069376 A1 | | 7/2005 |
| WO | 2008012235 A1 | | 1/2008 |
| WO | 2010146510 A2 | | 12/2010 |
| WO | 2011/064403 | | 6/2011 |
| WO | 2011064403A1 A1 | | 6/2011 |
| WO | WO 2011/064403 | | 6/2011 |
| WO | WO 2013/064507 | | 5/2013 |
| WO | WO 2013/064510 | | 5/2013 |
| WO | WO 2013/064511 | | 5/2013 |
| WO | WO 2013/065035 | | 5/2013 |
| WO | 2015064758 A1 | | 5/2015 |
| WO | WO 2015/195123 | | 12/2015 |

OTHER PUBLICATIONS

Graaf et al., "On-Chip Integrated Optical Microspectrometer with Light-to-Frequency Converter and Bus Interface", IEEE International Solid-State Circuits Conference, http://citeseerx.ist.psu.edu/viewdoc/download?doi=10.1.1.29.4891&rep=rep1&type=pdf, 1999, 2 pages.

Minas et al., "An array of Fabry-Perot optical channels for biological fluids analysis", Sensors & Actuators, http://dei-s1.dei.uminho.pt/pessoas/higino/pampus/GM_SA_2004.pdf, Jun. 19, 2004, 6 pages.

Bogaerts et al., "High-end CMOS Active Pixel Sensor for Hyperspectral Imaging", Proceedings of IEEE Int. Workshop on CCD and Advanced Image Sensors, http://www.imagesensors.org/Past%20Workshops/2005%20Workshop/2005%20Papers/11%20Bogaerts%20et%20al.pdf, Jun. 9, 2005, 5 pages.

Frey et al., "Multispectral interference filter arrays with compensation of angular dependence or extended spectral range", 2015, 19 pages.

Girard-Desprolet, "Plasmon-based spectral filtering with metallic nanostructures for CMOS image sensors", PhD thesis, Univ. Grenoble Alpes, 2015, 225 pages.

McGrindle, "Structured photonic materials for multi-spectral imaging applications", PhD thesis, Univ. of Glasgow, http://theses.gla.ac.uk/6446/, Mar. 2015, 215 pages.

Atwater, "Plasmonic Structures for CMOS Photonics and control of spontaneous Emission", AFRL report, http://www.dtic.mil/dtic/tr/fulltext/u2/a578545.pdf, Apr. 2013, 16 pages.

Xu et al., "Plasmonic nanoresonators for high-resolution color filtering and spectral imaging", Nature Comm., http://www.nature.com/ncomms/journal/v1/n5/full/ncomms1058.html, Aug. 24, 2010, 5 pages.

Wang et al., "Ultra-high-sensitivity color imaging via a transparent diffractive-filter array and computational optics", Optica 2 (11), https://www.osapublishing.org/optica/abstract.cfm?uri=optica-2-11-933, Oct. 29, 2015, 9 pages.

Fluckiger, "GSolver: Diffraction Grating Analysis for Windows", software for calculating performance of gratings, http://www.gsolver.com/http://www.gsolver.com/UserManual.pdf, Apr. 26, 2006, 131 pages.

Della Patria et al., "Visible-Infrared Imaging by a portable spectrometer with linear variable filters", 3rd annual hyperspectral imaging conference, Rome, https://www.academia.edu/4591078/Conference_Chair_Visible-Infrared_Imaging_by_a_Portable_Spectrometer_with_Linearly_Variable_Filters, May 15, 2012, 7 pages.

Hintschich et al., "MEMS-based miniature near-infrared spectrometer for application in environmental and food monitoring", Proceedings of 8th Inter. Conf. on Sensing Tech., Liverpool, http://s2is.org/ICST-2014/papers/1569977743.pdf, Sep. 2, 2014, 5 pages.

Gibbons, "Hyperspectral Imaging; What is is? How does it work?", Photonics Tech Briefs, http://www.techbriefs.com/component/content/article/ntb/features/application-briefs/19507, Mar. 1, 2014, 2 pages.

Ross, "Iris Recognition: the path forward", IEEE Computer Society, http://www.cse.msu.edu/~rossarun/pubs/RossIrisPathForward_IEEECOMP2010.pdf, Feb. 2010, 7 pages.

Ma et al., "CMOS-compatible integrated spectrometer based on Echelle Diffraction Grating and MSM photodetector array", IEEE Photonics Journal 5(2), http://ieeexplore.ieee.org/stamp/stamp.jsp?tp=&arnumber=6472720, Apr. 15, 2013, 8 pages.

Vagni, "Survey of hyperspectral and multispectral imaging technologies", RTO / NATO technical report, www.dtic.mil/cgi-bin/GetTRDoc?AD=ADA473675, May 2007, 44 pages.

Aubury et al., "Binomial Filters", Journal of VLSI Signal Processing, I, 1-8, http://www.doc.ic.ac.uk/~wl/papers/bf95.pdf, Jul. 24, 1995, 27 pages.

Lumidigm, "V-Series Fingerprint Sensors", http://www.hidglobal.com/products/biometrics/lumidigm/lumidigm-v-series-fingerprint-sensors, Aug. 18, 2015, 5 pages.

Fraunhofer IPMS, "Miniaturized MEMS Grating Spectrometer", http://www.ipms.fraunhofer.de/content/dam/ipms/common/products/SAS/mini-spektrometer-e.pdf, Oct. 13, 2012, 2 pages.

Lapray et al., "Multispectral Filter Arrays: Recent Advances and Practical Implementation", http://www.mdpi.com/1424-8220/14/11/21626/htm, Nov. 17, 2014, 34 pages.

Gonzalez et al., "A CMOS-compatible, monolithically integrated snapshot-mosaic multispectral imager", NIR news 26 (4), Jun. 2015, 4 pages.

De Munck et al., "High performance hybrid and monolithic backside thinned CMOS imagers realized using a new integration process", Electr. Devices Meeting IEDM, 2006, 4 pages.

Walls et al., "Fabry-Perot Resonator with nanostructures for multispectral visible filtering",, 2th IEEE Int. Conf. on Nanotechn. (IEEE-NANO), Aug. 20, 2012, 5 pages.

Choi, "apollo: nano spectrometer on-a-chip", presentation at TSensors, NanoLambda, http://www.memsindustrygroup.org/general/custom.asp?page=TSensors2013rsc, Oct. 23, 2013, 100 pages.

Haibach et al., "Precision in multivariate optical computing", Applied Optics 43 (10), Apr. 1, 2014, 11 pages.

Rowe et al., "Multispectral Fingerprint Biometrics", Proceed. 2005 IEEE Workshop on Information Assurance and Security, http://ieeexplore.ieee.org/xpl/login.jsp?tp=&arnumber=1495928&url=http%3A%2F%2Fieeexplore.ieee.org%2Fxpls%2Fabs_all.jsp%3Farnumber%3D1495928, 2005, 7 pages.

Williamson et al., "The Multivariate Optical Element Platform", CIRTEMO, LLC, 2013, 14 pages.

Consumer Physics, "Investor Presentation", Feb. 2015, 46 pages.

Stewart et al., "Multispectral Thin Film Biosensing and Quantitative Imaging Using 3D Plasmonic Crystals", ac research, Analytical Chemistry, vol. 81, No. 15, Aug. 1, 2009, 10 pages.

Extended European Search Report corresponding to EP 16207163.3 dated May 24, 2017, 8 pages.

Grum F., et al., "Optical Radiation Measurements," China Machine Press, Jan. 2013, Edition 1, pp. 217.

Principles of Optics, Born. Marcos, Electronic Industry Press, Nov. 2013, pp. 323.

(56) References Cited

OTHER PUBLICATIONS

Extended European Search Report for Application No. EP16207162.5, dated May 24, 2017, 12 pages.
Jung B.Y., et al., "Control of Resonant Wavelength From Organic Light-emitting Materials by Use of a Fabry-perot Microcavity Structure," Applied optics, Jun. 2002, vol. 41(16), 8 pages.

* cited by examiner

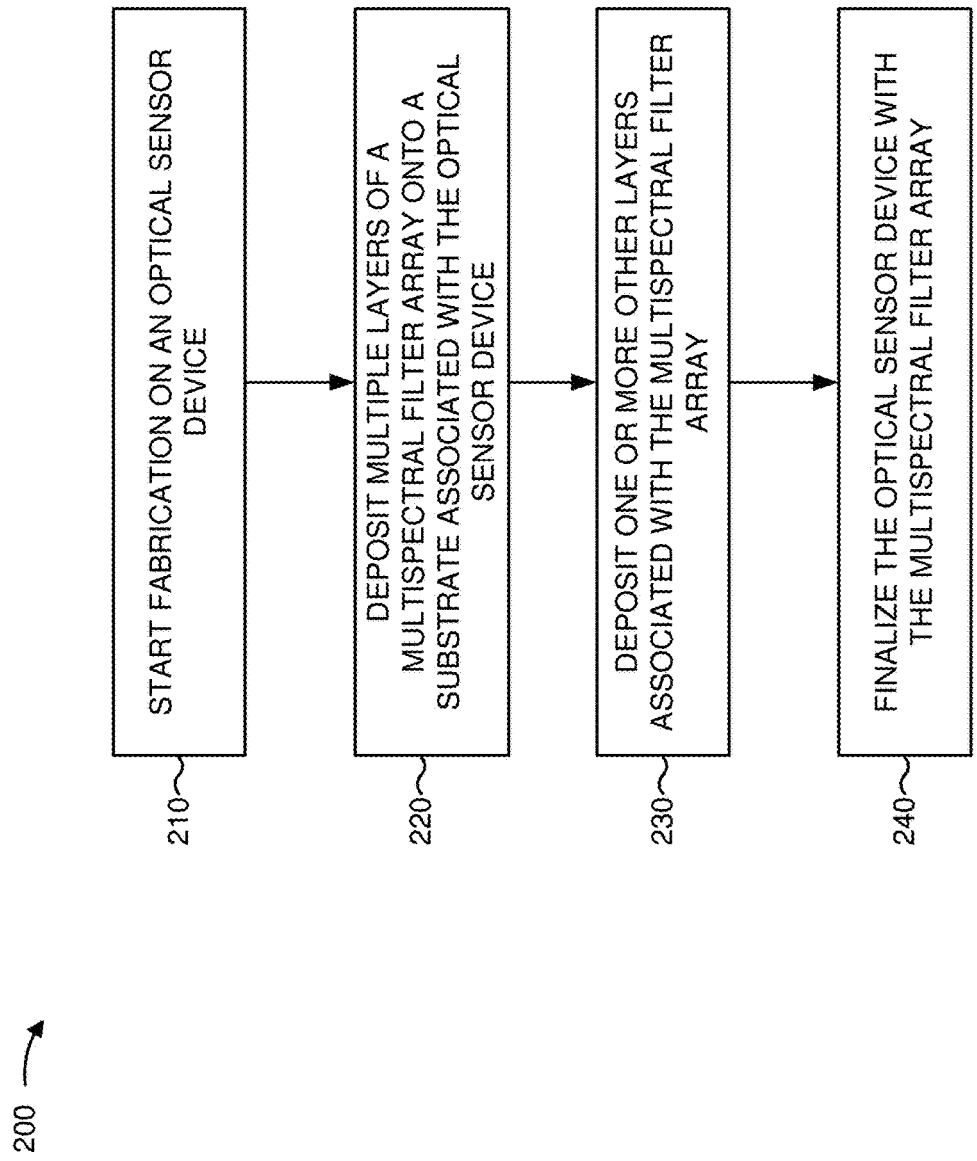

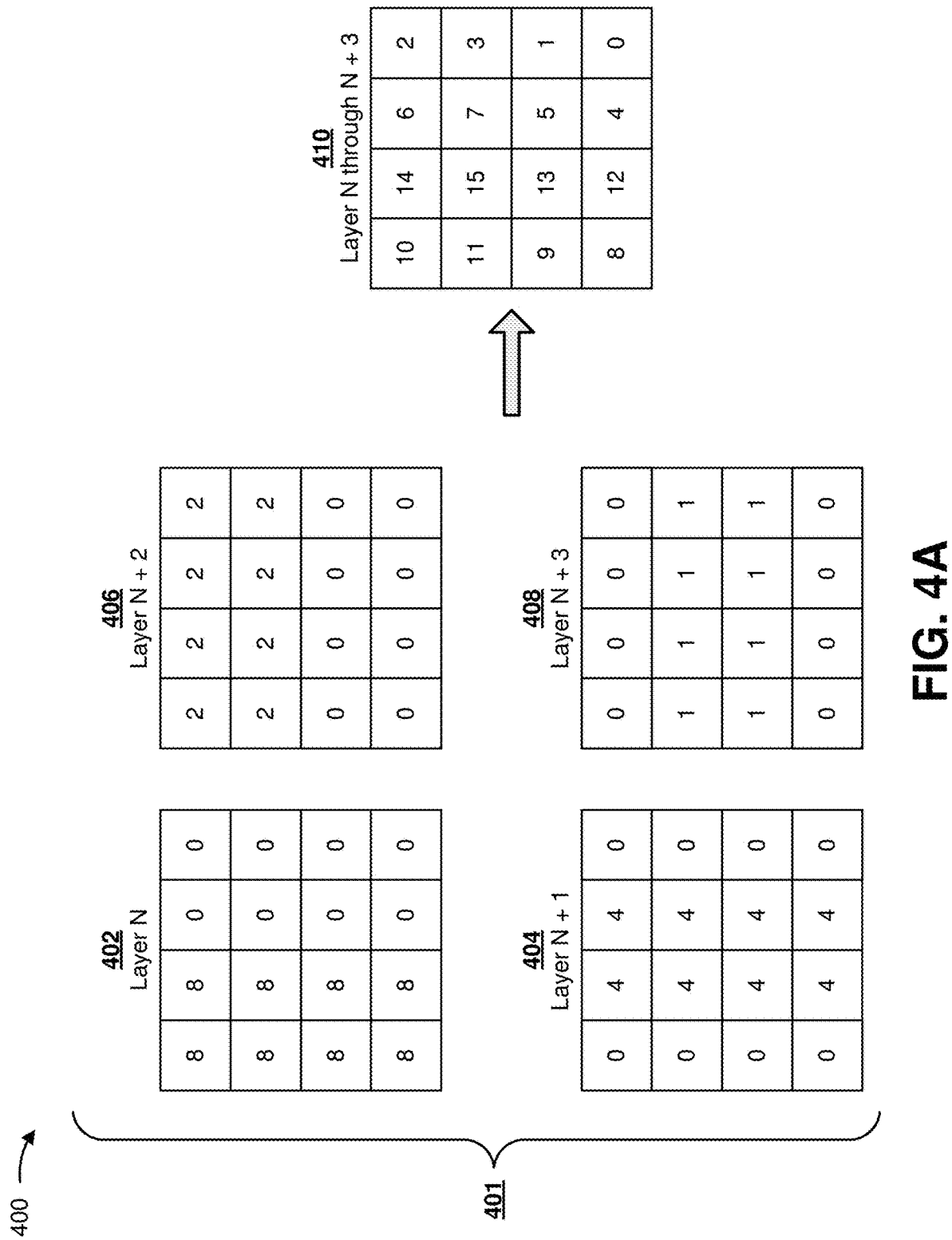

DIELECTRIC MIRROR BASED MULTISPECTRAL FILTER ARRAY

RELATED APPLICATION(S)

This application is a continuation of U.S. patent application Ser. No. 15/388,543, filed Dec. 22, 2016 (now U.S. Pat. No. 9,960,199), which claims priority under 35 U.S.C. § 119 to U.S. Provisional Patent Application No. 62/272,086, filed on Dec. 29, 2015, the contents of which are incorporated herein in their entireties.

U.S. patent application Ser. No. 15/388,543, also claims priority under 35 U.S.C. § 119 to U.S. Provisional Patent Application No. 62/294,970, filed on Feb. 12, 2016, the content of which is incorporated by reference herein in its entirety.

BACKGROUND

A multispectral imaging device may be utilized to capture multispectral image data. For example, the multispectral imaging device may capture image data relating to a set of electromagnetic frequencies. The multispectral imaging device may include a set of sensor elements (e.g., optical sensors, spectral sensors, and/or image sensors) that capture the image data. For example, an array of sensor elements may be utilized to capture information relating to multiple frequencies. A particular sensor element, of the sensor element array, may be associated with a filter that restricts a range of frequencies that are directed toward the particular sensor element.

SUMMARY

According to some possible implementations, an optical sensor device may include a set of optical sensors. The optical sensor device may include a substrate. The optical sensor device may include a multispectral filter array disposed on the substrate. The multispectral filter array may include a first dielectric mirror disposed on the substrate. The multispectral filter array may include a spacer disposed on the first dielectric mirror. The spacer may include a set of layers. The multispectral filter array may include a second dielectric mirror disposed on the spacer. The second dielectric mirror may be aligned with two or more sensor elements of a set of sensor elements.

According to some possible implementations, an optical filter may include a first layer. The first layer may be a first dielectric mirror to reflect a portion of light directed toward the first layer. The first layer may be deposited on a substrate associated with a set of optical sensors. The optical filter may include a second set of layers. The second set of layers may be deposited solely on the first layer. The second set of layers may be associated with a set of channels corresponding to a set of sensor elements. A channel, of the set of channels, may be associated with a particular thickness corresponding to a particular wavelength of light that is to be directed toward a particular optical sensor of the set of optical sensors. The optical filter may include a third layer. The third layer may be a second dielectric mirror to reflect a portion of light directed toward the third layer. The third layer may be deposited on a plurality of the set of sensor elements associated with the second set of layers.

According to some possible implementations, a system may include a set of optical sensors embedded into a substrate. The system may include a multispectral filter array deposited on the substrate. The multispectral filter may include a first dielectric mirror to partially reflect light from a light source. The first dielectric mirror may include a first quarterwave stack of high-index and low-index layers. The multispectral filter may include a second dielectric mirror to partially reflect light from the light source. The second dielectric mirror may include a second quarterwave stack of high-index and low-index layers. The multispectral filter array may include a plurality of high-index spacer layers disposed between the first dielectric mirror and the second dielectric mirror.

BRIEF DESCRIPTION OF THE DRAWINGS

FIG. 2 is a diagram of an example process for fabricating a sensor device with a multispectral filter array;

FIGS. 4A-4C are diagrams of another example implementation relating to the example process shown in FIG. 2;

DETAILED DESCRIPTION

The following detailed description of example implementations refers to the accompanying drawings. The same reference numbers in different drawings may identify the same or similar elements.

A sensor element (e.g., an optical sensor) may be incorporated into an optical sensor device to obtain information (e.g., spectral data) regarding a set of electromagnetic frequencies. For example, an optical sensor device may include a particular sensor element, such as an image sensor, a multispectral sensor, or the like that perform a sensor measurement of light directed toward the particular sensor element. In this case, the optical sensor device may utilize one or more image sensor technologies, such as an image sensor using a complementary metal-oxide-semiconductor (CMOS) technology, an image sensor using a charge-coupled device (CCD) technology, or the like. The optical sensor device may include multiple sensor elements (e.g., an array of sensor elements, a super array of sensor elements, a distributed array of sensor elements, etc.), each configured to obtain image data. Additionally, or alternatively, the optical sensor device may include a set of sensor elements configured to obtain a set of images, each associated with a different wavelength of light.

A sensor element may be associated with a filter that filters light for the sensor element. For example, the sensor element may be aligned with a linear variable filter (LVF), a circular variable filter (CVF), a Fabry-Perot filter, or the like to cause a portion of light directed toward to the optical sensor to be filtered. However, it may be difficult to integrate a filter array using LVFs or CVFs or pattern a filter in association with a semiconductor. Moreover, some sets of filters, that are utilized for multispectral sensing, may be associated with relatively high angle shift values, relatively small spectral ranges, or the like, which may reduce a spectral range of information that can be captured or an accuracy of information that is captured. Furthermore, an environmental condition, such as a temperature or the like, may affect operation of the sensor element by causing a filter to shift a wavelength of light that is directed toward the sensor element.

Implementations, described herein, may utilize an environmentally durable multispectral filter array using dielectric mirrors, such as quarterwave stack type mirrors or a distributed Bragg reflector type mirrors for multispectral sensing. In this way, an optical filter may be provided for an optical sensor device with improved durability, improved spectral range, improved thermal shift, improved transmissivity, and reduced angle shift relative to one or more other types of filters. Moreover, a difficulty in incorporating a filter onto a semiconductor-based sensor element or sensor element array may be reduced relative to one or more other types of filters.

Figure 1:
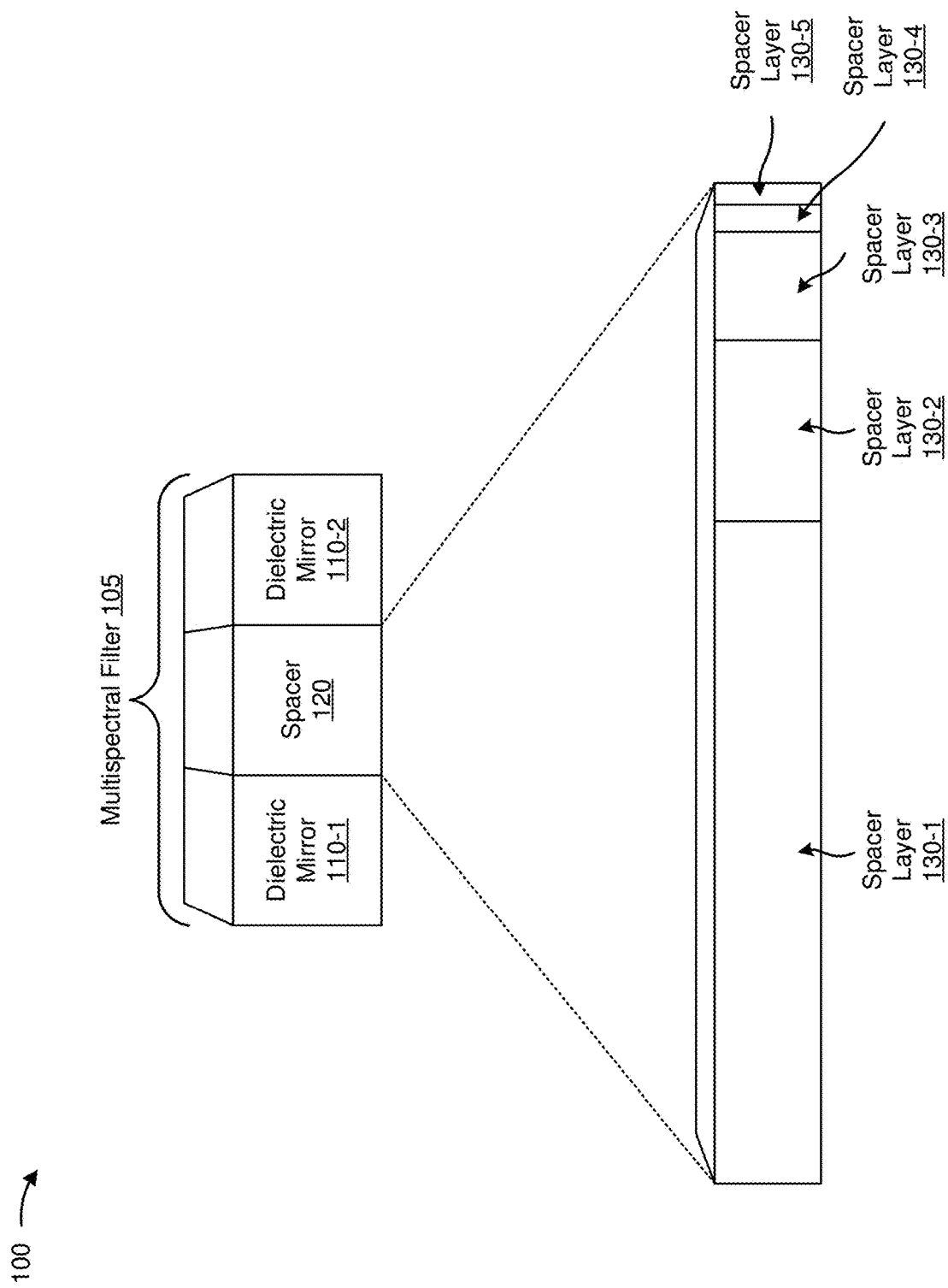
FIG. 1 is a diagram of an overview of an example implementation described herein.

FIG. 1 is a diagram of an overview of an example implementation 100 described herein. As shown in FIG. 1, a multispectral filter 105 may include a first dielectric mirror 110-1, a second dielectric mirror 110-2, and a spacer 120.

As further shown in FIG. 1, first dielectric mirror 110-1 and second dielectric mirror 110-2 may sandwich spacer 120. In other words, spacer 120 may separate first dielectric mirror 110-1 and second dielectric mirror 110-2 by a threshold distance, and/or faces of spacer 120 may be at least partially enclosed by first dielectric mirror 110-1 and second dielectric mirror 110-2. In some implementations, dielectric mirrors 110 may be associated with a particular material. For example, dielectric mirrors 110 may be deposited layers of dielectric material forming a quarterwave stack (e.g., a set of deposited hydrogenated silicon layers or silicon-dioxide layers). Dielectric mirror 110-2 may align with each sensor element of a sensor element array associated with each channel of the multispectral filter array.

In some implementations, spacer 120 may include one or more spacer layers 130. For example, spacer 120 may include a set of spacer layers 130-1 through 130-5 (e.g., dielectric layers). In some implementations, a thickness of one or more layers 130 may be associated with ensuring a minimum spacer thickness for a particular wavelength.

In some examples, such as for a wavelength of 842 nanometers (nm) that is to be directed toward one or more sensors, layer 130-1 may be associated with a thickness of 108.5 nm. In this way, spacer 120 ensures a minimum separation between dielectric mirrors 110 for a wavelength of light that is to be directed toward one or more sensor elements. In some implementations, a thickness of one or more spacer layers 130 may be related based on a binary progression. For example, spacer layer 130-2 may be associated with a thickness of approximately 26.9 nanometers (nm), spacer layer 130-3 may be associated with a thickness of approximately 13.5 nm, spacer layer 130-4 may be associated with a thickness of approximately 6.7 nm, and spacer layer 130-5 may be associated with a thickness of approximately 3.4 nm.

In some implementations, multispectral filter 105 may be deposited onto a substrate associated with an optical sensor device of a sensor system. For example, dielectric mirror 110-1 may be deposited (e.g., via a deposition process and/or a photolithographic lift-off process) onto a substrate that includes an array of sensor elements to capture information (e.g., spectral data). In some implementations, spacer 120 may permit capture of information relating to multiple wavelengths. For example, a first portion of spacer 120 aligned with a first sensor element (e.g., a back illuminated optical sensor or a front illuminated optical sensor) may be associated with a first thickness and a second portion of spacer 120 aligned with a second optical sensor may be associated with a second thickness. In this case, light that is directed toward the first sensor element and the second sensor element may correspond to a first wavelength at the first sensor element based on the first thickness and a second wavelength at the second sensor element based on the second thickness. In some implementations dielectric mirror 110-1 and/or 110-2 may be aligned with sensor elements of the sensor system, such as a majority of the sensor elements, all of the sensor elements, or the like. In this way, multispectral filter 105 permits multispectral sensing by an optical sensor device using a spacer (e.g., spacer 120) associated with multiple portions, which are associated with multiple thicknesses, aligned to multiple sensor elements of the optical sensor device.

As indicated above, FIG. 1 is provided merely as an example. Other examples are possible and may differ from what was described with regard to FIG. 1.

Figure 3A:
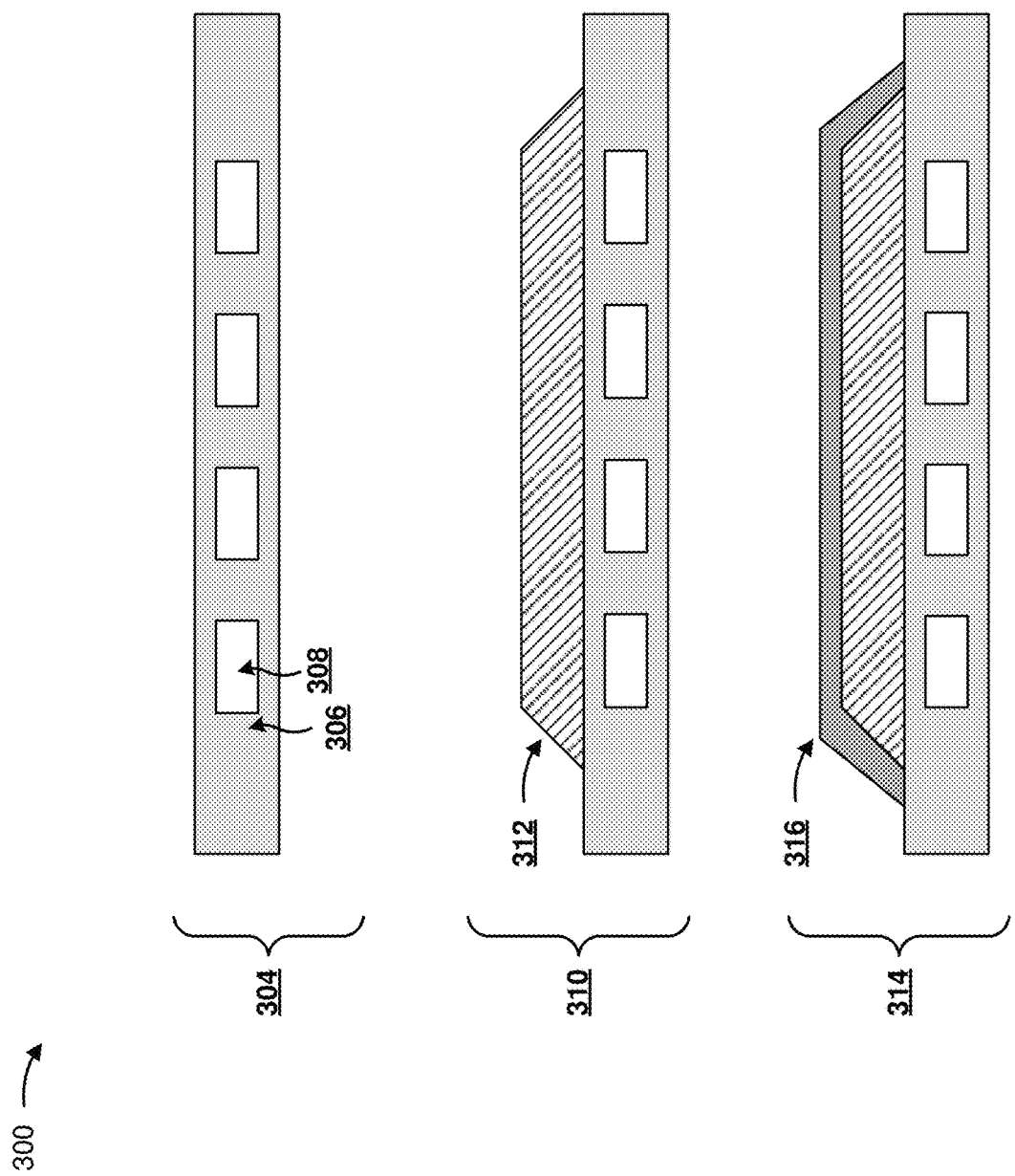
FIGS. 3A-3C are diagrams of an example implementation relating to the example process shown in FIG. 2.
Figure 3B:
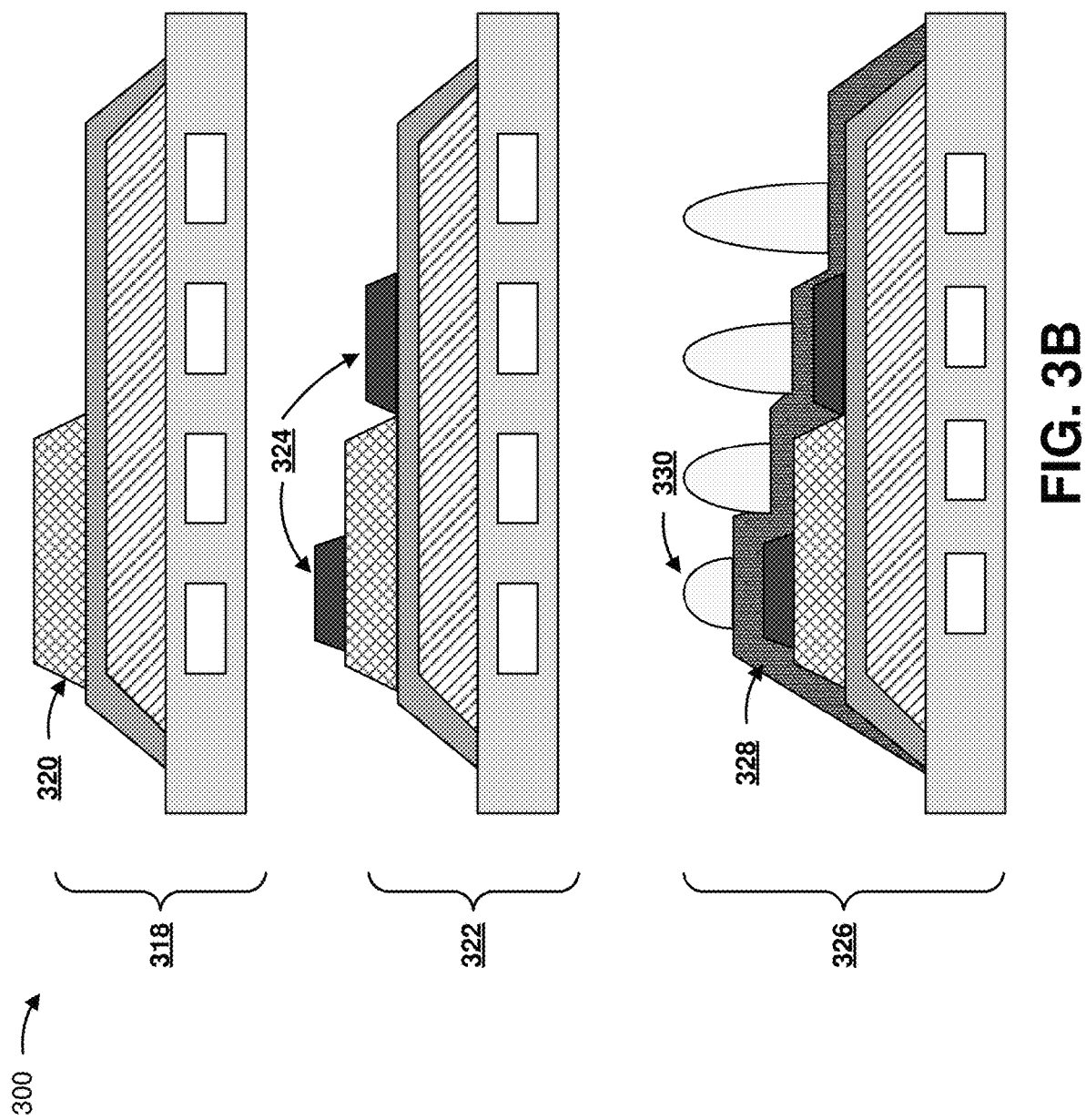
Figure 3C:
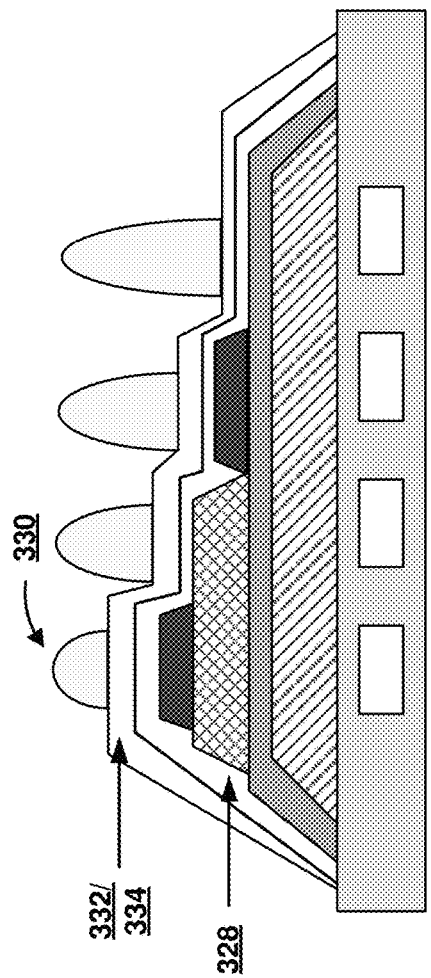

FIG. 2 is a flow chart illustrating an example process 200 for fabricating an optical sensor device with a multispectral filter array, such as multispectral filter 105 shown in FIG. 1. Process 200 may be applied to the design of an optical sensor device with a multispectral filter array used to capture information relating to a spectral measurement. FIGS. 3A-3C are diagrams of an example implementation 300 relating to example process 200 shown in FIG. 2.

As shown in FIG. 2, process 200 may include starting fabrication on an optical sensor device (block 210). For example, as shown in FIG. 3A, and by reference number 304, a substrate 306 may include a set of sensor elements 308 embedded into substrate 306. In some implementations, substrate 306 may be associated with a particular composition. For example, substrate 306 may include a silicon-based substrate. In another example, substrate 306 may include a glass-based substrate, and sensor elements 308 may be disposed in a silicon-based wafer, which is bonded to the glass-based substrate, as described herein with regard to FIGS. 8A and 8B. Additionally, or alternatively, substrate 306 may be associated with a multispectral filter array that is associated with a relatively low angle shift under a relatively high temperature condition (e.g., a heat tolerant filter array).

In some implementations, substrate 306 may include one or more conductive pathways (not shown) to provide information obtained by the set of sensor elements 308. For example, substrate 306 may include a set of conductive pathways permitting substrate 306 to be mounted to another device and provide data from the set of sensor elements 308 to the other device, such as a camera device, a scanning device, a measurement device, a processor device, a microcontroller device, or the like. In some implementations, substrate 306 may be associated with multiple layers of substrate material. For example, substrate 306 may include a multi-layer substrate, a layer of which is associated with receiving the set of sensor elements 308.

In some implementations, substrate 306 may be associated with a particular type of sensor element 308. For example, substrate 306 may be associated with one or more photodiodes (e.g., a photodiode array), one or more sensor elements of a sensor array coating or in a proximity to CMOS technology, CCD technology, or the like. In some implementations, sensor elements 308 may include a set of back illuminated optical sensors. In this case, substrate 306 may be thinner relative to another configuration, thereby permitting light to be directed through a silicon surface toward the optical sensors.

As further shown in FIG. 2, process 200 may include depositing multiple layers of a multispectral filter array onto a substrate associated with the optical sensor device (block 220). For example, as further shown in FIG. 3A, and by reference number 310, a first mirror structure 312 may be deposited onto substrate 306. In some implementations, first mirror structure 312 may be a dielectric mirror disposed in alignment with a set of sensor elements of the optical sensor device (e.g., sensor elements 308). In some implementations, first mirror structure 312 may be associated with a uniform thickness. In some implementations, first mirror structure 312 may be disposed within a threshold proximity of substrate 306, such as onto an intermediate layer between substrate 306 and first mirror structure 312. In other words, first mirror structure 312 is not necessarily disposed onto substrate 306, but may be disposed onto an intermediate layer between substrate 306 and first mirror structure 312.

In some implementations, mirror structure 312 may be associated with a particular composition, such as a dielectric composition. For example, mirror structure 312 may utilize an oxide based material (e.g., a high-index oxide, such as $Nb_2O_5$, $Ta_2O_5$, $TiO_2$, $HfO_2$, or the like or a low-index oxide, such as $SiO_2$, $Al_2O_3$, or the like), a nitride based material (e.g., $Si_3N_4$), a germanium based material, a silicon based material (e.g., a hydrogenated silicon based material or a silicon-carbide based material), or the like.

In some implementations, mirror structure 312 may include a partially transparent material. For example, mirror structure 312 may permit a first portion of light (e.g., a first wavelength band) to be directed toward the set of sensor elements 308 and a second portion of light (e.g., a second wavelength band) to be re-directed away from the set of sensor elements 308. In some implementations, mirror structure 312 and/or one or more other layers may be deposited onto substrate 306 or onto another layer using a pulsed magnetron sputtering deposition process, a lift-off process, or the like. For example, a coating platform may be associated with depositing mirror structure 312 with a thickness based on a refractive index of a selected material and a desired wavelength of the mirrors. Similarly, a coating platform may be associated with a particular semiconductor wafer size (e.g., a 200 millimeter (mm) wafer or a 300 mm wafer), and may utilize a pulsed magnetron to perform deposition of layers, as described herein, of a particular thickness (e.g., a less than 5 nanometers (nm) thickness, a less than 2 nm thickness, or a less than 1 nm thickness for some spacer layers and other thicknesses, such as greater than 5 nm, greater than 100 nm, or the like for other spacer layers).

In some implementations, a set of spacer layers of a spacer may be deposited to separate mirror structure 312 from another mirror structure. For example, as further shown in FIG. 3A, and by reference number 314, a first spacer layer 316 of a cavity may be deposited onto mirror structure 312 (e.g., using a pulsed magnetron sputtering deposition process). In some implementations, first spacer layer 316 may be deposited onto mirror structure 312 based on a patterning technique. For example, a lift-off process may be utilized to form first spacer layer 316 with a particular thickness. First spacer layer 316 and/or another spacer layer may be disposed completely onto mirror structure 312. For example, first spacer layer 316 may include one or more discrete portions that form a continuous spacer layer on a continuous, dielectric mirror. In this case, first spacer layer 316 and/or one or more other spacer layers may form a plurality of channels aligned with the set of sensor elements 308, which as a complete set of layers with first mirror structure 312 and another mirror structure, described herein, direct light toward a corresponding plurality of sensor elements 308.

In some implementations, first spacer layer 316, in association with first mirror structure 312 and another mirror structure, described herein, may be associated with performing a particular filtering functionality. In some implementations, based on a desired spectral range from a light source (e.g., between approximately 380 nanometers and approximately 1110 nanometers passed to the optical sensors) or a desire for a reduced angle shift, first spacer layer 316 and/or one or more other spacer layers may utilize an oxide-based material (e.g., niobium-titanium-oxide (NbTiOx), niobium oxide, titanium oxide, tantalum oxide, a combination thereof, etc. for a visible spectral range), a nitride-based material (e.g., silicon nitride), a silicon-based material (e.g., hydrogenated silicon (SiH) for a spectral range greater than 650 nm, silicon carbide (SiC) or silicon (Si)), a germanium (Ge)-based material (e.g., for an infrared spectral range), or the like. In some implementations, first spacer layer 316 may utilize a particular material to achieve a reduction in angle shift relative to another material. For example, utilizing an Si—H based material may result in a reduced angle shift relative to using a silicon-dioxide ($SiO_2$)-based material. In another example, first spacer layer 316 may utilize another type of oxide material, nitride material, fluoride material, or the like. In some implementations, the light source may generate light at a particular spectral range (e.g., between approximately 700 nanometers and approximately 1100 nanometers).

In some implementations, mirror structure 312 and/or one or more other mirror structures and first spacer layer 316 and/or one or more other spacer layers may be selected to maximize an index ratio between a set of spacer layers and a set of mirrors. For example, the optical sensor device may utilize a silicon-dioxide ($SiO_2$) based material (a refractive index of approximately 1.47 at 890 nm) for a low-index layer material in the dielectric mirror, and may utilize a hydrogenated silicon (Si:H) based material (a refractive index of approximately 3.66 at 890 nm) for a high-index layer material in the dielectric mirror. Similarly, the optical sensor device may utilize a niobium-titanium-oxide (Nb-$TiO_x$) based material (a refractive index of approximately 2.33 at 890 nm). For example, mirror structure 312 and/or one or more other mirror structures may utilize the silicon-dioxide based material and/or the hydrogenated silicon based material to provide a relatively large spectral range, and first spacer layer 316 and/or one or more other spacer layers may utilize hydrogenated silicon based material or the niobium-titanium-oxide, tantalum oxide, niobium oxide, titanium oxide, a mixture thereof, or the like based material to provide a relatively reduced thermal shift.

As shown in FIG. 3B, and by reference number 318, a second spacer layer 320 may be deposited onto first spacer layer 316. For example, second spacer layer 320 may be deposited using a reactive magnetron sputtering process, a pulsed-magnetron sputtering process, an ion beam assisted deposition process, an ion beam sputtering process, a dual ion beam sputtering process, a reactive direct current sputtering process, an alternating current sputtering process, a radio frequency sputtering process, an atomic layer deposition process, or the like. Although described herein in terms of a particular order of deposition of layers, another order of deposition of layers may be utilized.

In some implementations, second spacer 120 may be associated with a thickness relating to first spacer layer 316. For example, when first spacer layer 316 is associated with a first thickness t₀, second spacer layer 320 may be deposited with a second thickness t₁. In some implementations, second spacer layer 320 may be deposited onto a portion of first spacer layer 316. For example, based on a desired spacer thickness arrangement for a set of channels (e.g., for a set of sensor elements 308 associated with the set of channels), second spacer layer 320 may be deposited onto a subset of a surface of first spacer layer 316 to cause a first sensor element 308 to be associated with a first spacer thickness and a second sensor element 308 to be associated with a second spacer thickness, thereby permitting first sensor element 308 to capture information associated with a first wavelength and second sensor element 308 to capture information associated with a second wavelength. Additionally, or alternatively, a first layer may be deposited and may cover a set of sensor elements, a second layer may be deposited and may cover half of the set of sensor elements, a third layer may be deposited and may cover a portion of the set of sensor elements, etc. Further details regarding patterning of a set of spacer layers are described with regard to FIGS. 4A-4C and FIGS. 5A and 5B.

As further shown in FIG. 3B, and by reference number 322, a third spacer layer 324 may be deposited onto second spacer layer 320 and/or first spacer layer 316. For example, third spacer layer 324 and/or one or more subsequent spacer layers (not shown) may be deposited. In some implementations, third spacer layer 324 (and/or one or more other spacer layers n, where n≥2) may be associated with half a thickness of a previous layer (e.g., second spacer layer 320 for third spacer layer 324). In other words, third spacer layer 324 may have a thickness of ½ of the thickness of second spacer layer 320. In some implementations, third spacer layer 324 may be selectively deposited onto a portion of first spacer layer 316 and/or second spacer layer 320. For example, a first portion of third spacer layer 324 may be deposited onto a portion of first spacer layer 316 and a second portion of third spacer layer 324 may be deposited onto a portion of second spacer layer 320, thereby permitting multiple sensor elements 308 to be associated with multiple spacer thicknesses and capture information associated with multiple wavelengths.

As further shown in FIG. 3B, and by reference number 326, a mirror structure 328 may be deposited. For example, mirror structure 328 may be deposited onto one or more portions of one or more layers (e.g., first spacer layer 316, second spacer layer 320, third spacer layer 324, or another subsequent layer). In some implementations, mirror structure 328 may be a dielectric mirror disposed in alignment with optical sensors of the optical sensor device (e.g., sensor elements 308). Based on spacer layers 316, 320, and 324 being deposited, mirror structure 328 is separated from mirror structure 312 by a cavity. In this way, light may be directed toward one or more sensor elements 308 at one or more wavelengths. In some implementations, another layer may be deposited between mirror structure 328 and spacer layer 324. For example, a thin film layer, or the like may be deposited to perform one or more functionalities.

As shown in FIG. 3C, before depositing lenses 330, an out-of-band blocker set of layers 332 (e.g., a set of layers forming a patterned blocker) may be deposited. Alternatively, an anti-reflective coating set of layers 334 may be deposited. In this case, as shown in FIG. 3C, mirror structure 328 may be deposited onto anti-reflective coating layer 334. In some implementations, multiple discrete filter coatings may be deposited. Additionally, or alternatively, a single blocker may be deposited to suppress out-of-band light for multiple wavelengths, multiple channels, or the like.

As further shown in FIG. 2, process 200, in some implementations, may include depositing one or more other layers associated with the multispectral filter array (block 230). For example, a filter, such as an anti-reflective coating filter (e.g., anti-reflective coating layers), an out-of-band blocking filter (e.g., out-of-band blocking layers), a higher-order suppression filter (e.g., higher order suppression layers), or the like may be deposited, such as onto mirror structure 328, as described in detail, herein. As further shown in FIG. 2, process 200 may include finalizing the optical sensor device with the multispectral filter array (block 240). For example, as further shown in FIG. 3B, and by reference number 326, a set of lenses 330 may be attached to mirror structure 328. For example, a particular lens 330, such as a glass lens, a plastic lens, or the like, may be attached to mirror structure 328 to alter a characteristic of light that is directed toward a corresponding sensor element 308, such as to focus the light, distort the light, direct the light, increase an angle tolerance with which light may enter the optical sensor device, increase an amount of light that is directed toward sensor element 308 of the optical sensor device, or the like.

In this way, a multispectral Fabry-Perot filter array may be constructed using dielectric mirrors and/or quarterwave stacks. Additionally, or alternatively, based on utilizing dielectric mirrors, a relatively large spectral range may be achieved relative to utilizing a different type of mirror. Additionally, or alternatively, based on using a niobium-titanium-oxide spacer layer, a relatively low thermal shift may be achieved relative to utilizing a different type of spacer and without substantially reducing a blocking range of the multispectral filter array. Additionally, or alternatively, based on utilizing a pulsed magnetron sputtering process and/or a liftoff process, the multispectral filter array may be incorporated into an optical sensor device with a semiconductor substrate without an excessive difficulty of manufacture.

Although FIG. 2 shows example blocks of process 200, in some implementations, process 200 may include additional blocks, fewer blocks, different blocks, or differently arranged blocks than those depicted in FIG. 2. Additionally, or alternatively, two or more of the blocks of process 200 may be performed in parallel. As indicated above, FIGS. 3A-3C are provided merely as an example. Other examples are possible and may differ from what was described with regard to FIGS. 3A-3C.

Figure 4B:
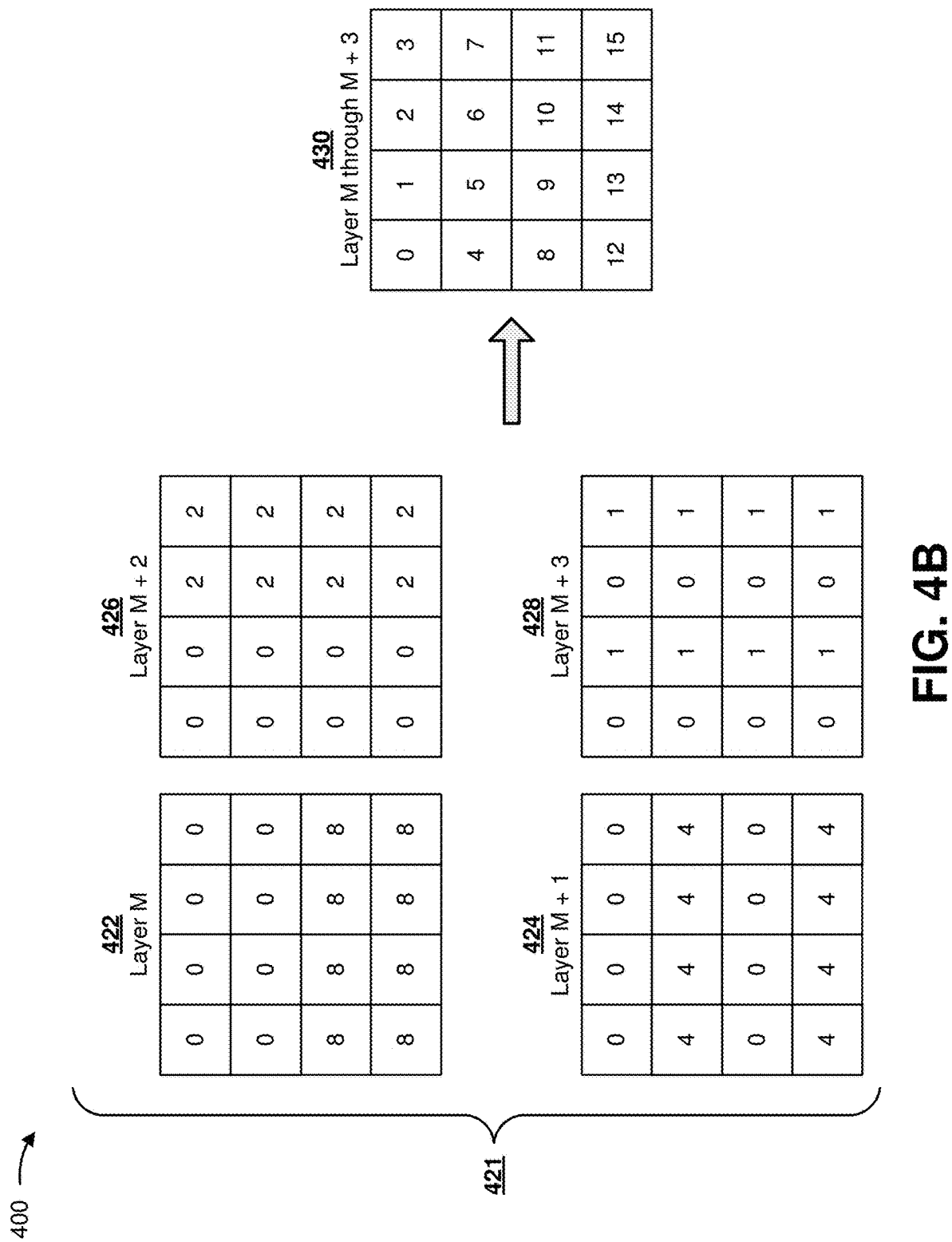
Figure 4C:
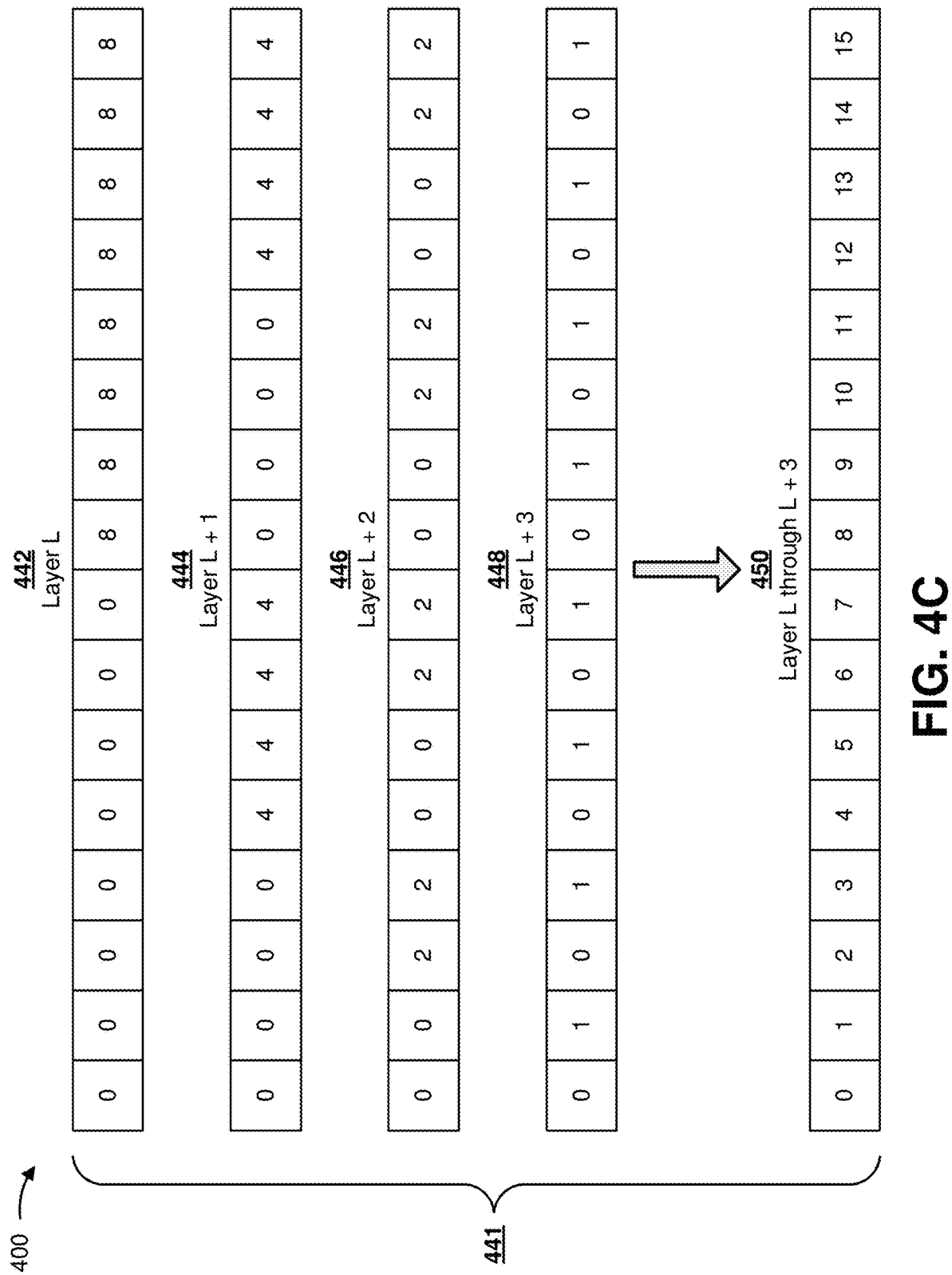

FIGS. 4A-4C are diagrams of an example implementation 400 relating to the example process 200 shown in FIG. 2. FIGS. 4A-4C show an example of a filter array layout for a multispectral filter.

As shown in FIG. 4A, a filter array 401 may be associated with a set of layers. Filter array 401 may be a 4×4 filter array including 16 channels (e.g., optical channels) corresponding to 16 sensor elements. In some implementations, filter array 401 corresponds to the example multispectral filter 105 shown in cross-section in FIG. 1. In some implementations, each channel may be associated with a sensor array. For example, a channel may include a sensor array with a set of sensor elements associated with capturing information regarding light directed using the channel. In some implementations, each channel may be associated with a particular thickness for each spacer layer. A thickness of a set of spacer layers of a channel may be selected based on a desired wavelength of information that is to be captured by an optical sensor corresponding to the channel. In some implementations, the 4×4 filter array (e.g., or another dimension filter array) may be associated with a particular patterning, such as a mosaic pattern (e.g., a snapshot Bayer mosaic pattern), a tiled pattern (e.g., a snapshot tiled pattern), a line pattern (e.g., a continuous line-scan pattern or a discontinuous line-scan pattern), or the like.

Based on the spectral range that is to be captured by the optical sensor, a thickness of a spacer layer sandwiched by mirrors of the 4×4 filter array may be determined:

$$t_{max}=2*(\lambda_{max}/(4*n_{ref}));$$

$$t_{min}=2*(\lambda_{min}/(4*n_{ref}));$$

where $t_{min}$ represents a total thickness of a spacer layer separating a set of mirror structures for a highest center wavelength for which information is to be captured, $\lambda_{max}$ represents the highest center wavelength for which image data is to be captured, $n_{ref}$ represents a refractive index of the spacer layer, $t_{min}$ represents a total thickness of a spacer layer separating a set of mirror structures for a lowest center wavelength for which image data is to be captured, and $\lambda_{min}$ represents the lowest center wavelength for which image data is to be captured.

A quantity of layers of the spacer layers that are to be deposited to form the set of channels (e.g., 16 channels of the 4×4 filter array) may be determined:

$$c=2^x;$$

where c represents a maximum number of channels that can be created for a given quantity of spacer layers that are deposited x. In some implementations, less than a maximum quantity of channels may be selected for a particular quantity of spacer layers. For example, although a maximum of 16 channels may be created with a deposition of 4 spacer layers, another quantity of channels may be selected for the 4 spacer layers, such as 9 channels, 10 channels, or the like. In this case, one or more channels may be omitted or duplicated. For example, when a particular optical sensor is associated with poor performance for capturing image data regarding a particular wavelength, information regarding the particular wavelength may be caused to be captured by multiple optical sensors associated with multiple channels to improve accuracy of the information.

A thickness for each layer of the spacer layers of a particular channel (e.g., for a set of equidistant channels) may be determined:

$$t_0=t_{min};$$

$$t_1=(c/2)/((c-1)*2*n_{ref})*(\lambda_{max}-\lambda_{min});$$

$$t_n=t_{n-1}/2;$$

$$n=\log_2(c)$$

where $t_n$ represents a thickness of an nth layer (e.g., to is a first layer and $t_1$ is a second layer) and c represents a channel number for a channel of a set of channels. In some implementations, a set of non-equidistant channels may be utilized. For example, a discontinuous patterning of channels may be selected to obtain information regarding a first set of wavelengths and a second set of wavelengths that is discontinuous with the first set of wavelengths. In this case, $t_{min}$ and $t_{max}$ may still be determined, but a different set of intermediate layers may be selected. In some implementations, a different quantity of channels may be utilized. Additionally, or alternatively, a patterning of channels may be utilized with multiple channels having a common thickness, thereby permitting multiple optical sensors to capture information regarding a common wavelength of light.

As shown by reference number 402, filter array 401 includes a layer 402 (e.g., of a spacer layer between a first mirror structure and a second mirror structure), N, for which each channel is associated with a particular thickness to cause a particular wavelength of light to be directed toward a corresponding optical sensor. For example, a first group of channels of layer 402 are associated with a thickness of $8*t_4$ (where $t_4$ represents a thickness of a fourth layer), indicating that a layer of thickness $8*t_4$ is deposited (e.g., onto a first mirror structure or onto another layer, such as a protective layer that is deposited onto the first mirror structure). Similarly, a second group of channels of layer 402 are associated with a thickness of $0*t_4$, indicating that for these channels, deposition is performed but lift-off is used to remove material that is deposited.

As further shown in FIG. 4A, and by reference number 404, a layer 404, N+1, is deposited onto layer 402. Layer 404 includes a first group of channels associated with a thickness of $4*t_4$ and a second group of channels associated with a thickness of $0*t_4$. In some implementations, a thickness of layer 404 is selected based on a thickness of layer 402. For example, when manufacturing a multispectral filter (e.g., a filter associated with a binary progression of filter layers), the thickness of layer 404 may be selected as one half the thickness of layer 402. In another example, another relationship between layer 402 and layer 404 may be utilized. For example, layer 404 may be 75% a thickness of layer 402 and a subsequent layer may be 33%, 25%, etc. the thickness of layer 404. In another example, layer 404 may be 50% a thickness of layer 402 and a subsequent layer may be 33% a thickness of layer 404, 10% a thickness of layer 404, or the like.

As further shown in FIG. 4A, and by reference number 406, a layer 406, N+2, is deposited onto layer 404. Layer 406 includes a first group of channels associated with a thickness of $2*t_4$ and a second group of channels associated with a thickness of $0*t_4$. As shown by reference number 408, a layer 408, N+3, is deposited onto layer 406. Layer 408 includes a first group of channels associated with a thickness of $1*t_4$ and a second group of channels associated with a thickness of $0*t_4$. As shown by reference number 410, a thickness of layers N through N+3 is identified for filter array 401 based on summing a thickness of each layer for each channel. For example, based on the binary progression and the arrangement of filter layers, each channel may be associated with a different thickness, thereby permitting each corresponding optical sensor to capture information regarding a different wavelength. A thickness of layer to (e.g., $t_{min}$) onto which $t_1$ to $t_n$ are disposed may be related to a wavelength of light regarding which information (e.g., spectral data) is to be captured.

As shown in FIG. 4B, a similar filter array 421 may be associated with a set of layers, which are each associated with one or more thicknesses. As shown by reference number 422, a layer 422, M, includes a first group of channels associated with a thickness of $8*t_4$ and a second group of channels associated with a thickness of $0*t_4$. As shown by reference number 424, a layer 424, M+1, includes a first group of channels associated with a thickness of $4*t_4$ and a second group of channels associated with a thickness of $0*t_4$. As shown by reference number 426, a layer 426, M+2, includes a first group of channels with a thickness of $2*t_4$ and a second group of channels with a thickness of $0*t_4$. As shown by reference number 428, a layer 428, M+3, includes a first group of channels with a thickness of $1*t_4$ and a second group of channels with a thickness of $0*t_4$. As shown by reference number 430, a result of depositing layers 422, 424, 426, and 428 is a set of thicknesses for a set of channels of filter array 421, permitting optical sensors of filter array 421 to capture image data relating to a set of wavelengths.

As shown in FIG. 4C, another filter array 441 may utilize a linear arrangement of 16 channels rather than the 4×4 arrangement of filter array 401 and filter array 421. As shown by reference number 442, a layer 442, L, includes a first group of channels with a thickness of $8*t_4$ and a second group of channels with a thickness of $0*t_4$. As shown by reference number 444, a layer 444, L+1, includes a first group of channels with a thickness of $4*t_4$ and a second group of channels with a thickness of $0*t_4$. As shown by reference number 446, a layer 446, L+2, includes a first group of channels with a thickness of $2*t_4$ and a second group of channels with a thickness of $0*t_4$. As shown by reference number 448, a layer 448, L+3, includes a first group of channels with a thickness of $1*t_4$ and a second group of channels with a thickness of $0*t_4$. As shown by reference number 450, a result of depositing layers 442, 444, 446, and 448 is a set of thicknesses for a set of channels of filter array 441 to cause a set of optical sensors to capture image data relating to a set of wavelengths.

As indicated above, FIGS. 4A-4C are provided merely as an example. Other examples are possible and may differ from what was described with regard to FIGS. 4A-4C.

Figure 5A:
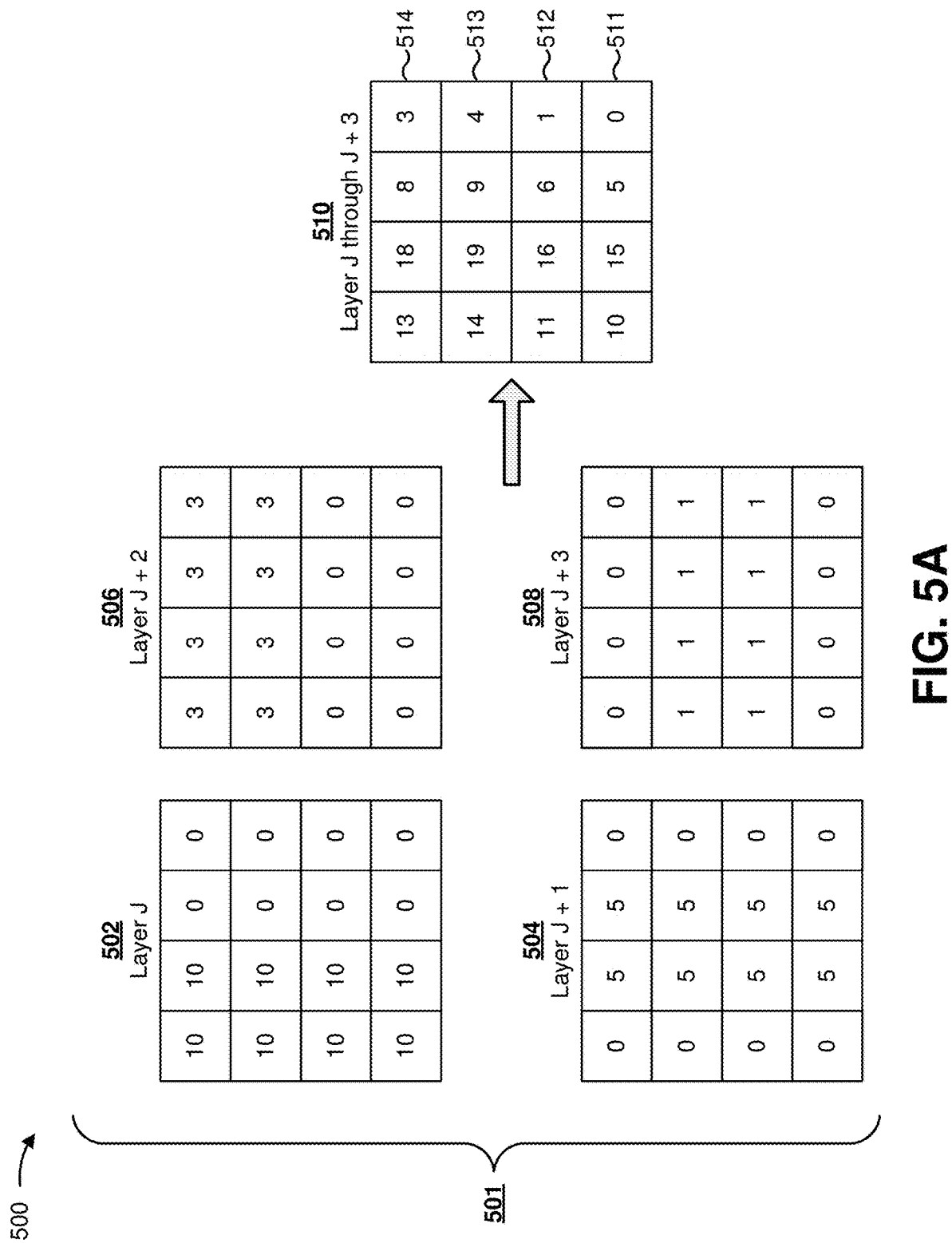
FIGS. 5A and 5B are diagrams of another example implementation relating to the example process shown in FIG. 2.
Figure 5B:
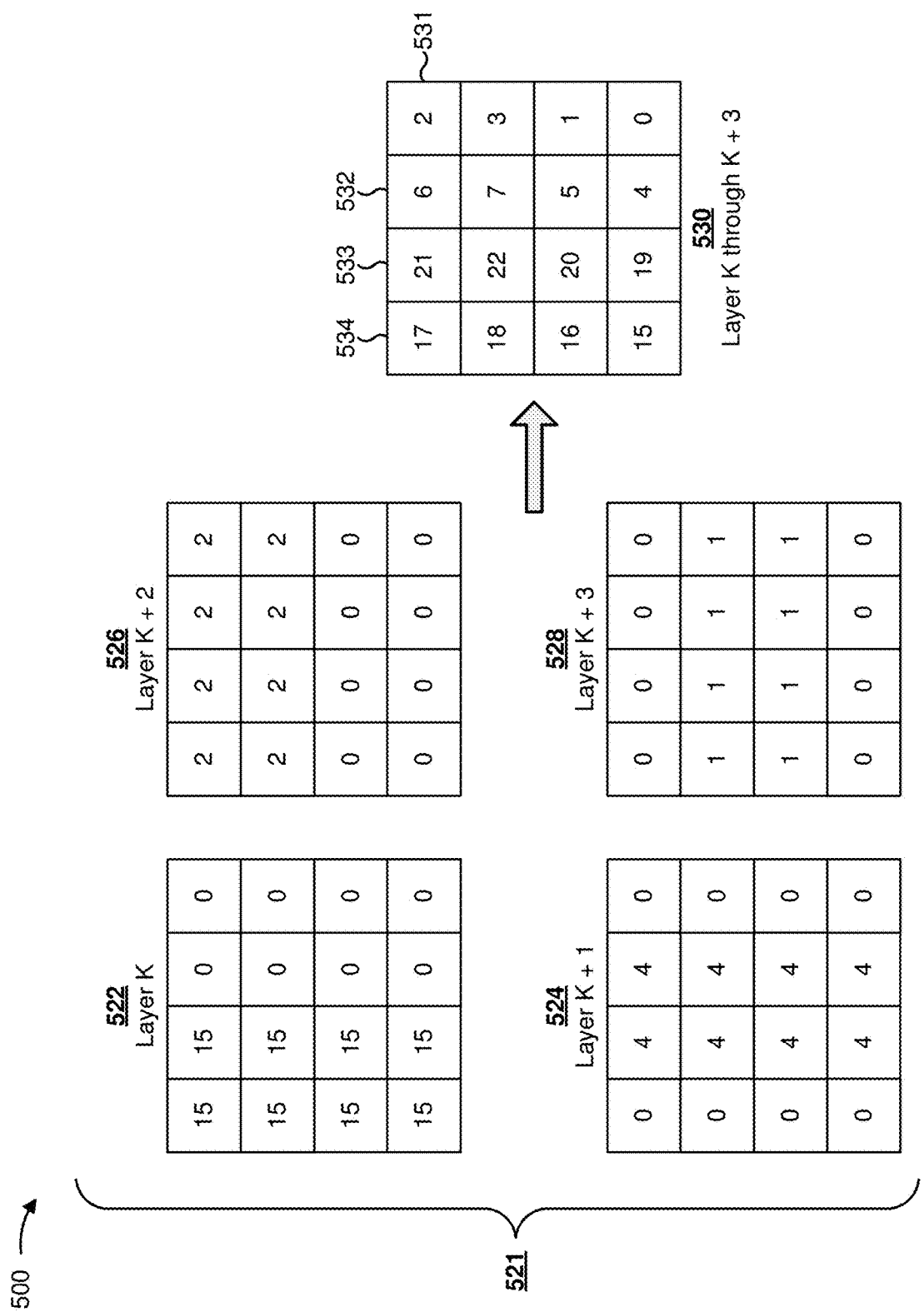

FIGS. 5A and 5B are diagrams of an example implementation 500 relating to the example process 200 shown in FIG. 2. FIGS. 5A and 5B show an example of a filter array layout for a multispectral filter with non-uniform channel spacing.

As shown in FIG. 5A, a filter array 501 (e.g., a multi-spectral filter) may utilize a non-equidistant channel layout. For example, as shown by reference numbers 502 through 508, layer 502 may include a group of channels with a thickness of $10*t_4$, layer 504 may include a group of channels with a thickness of $5*t_4$, layer 506 may include a group of channels with a thickness of $3*t_4$, and layer 508 may include a group of channels with a thickness of $1*t_4$. As shown by reference number 510, a result of depositing layers 502, 504, 506, and 508 is a set of thicknesses that are not equidistant for each channel. For example, channel 511 is associated with a thickness of $0*t_4$, channel 512 is associated with a thickness of $1*t_4$, channel 513 is associated with a thickness of $4*t_4$, and channel 514 is associated with a thickness of $3*t_4$ (e.g., a channel associated with a thickness of $2*t_4$ is omitted). In this way, filter array 501 may permit a set of optical sensors associated with filter array 501 to capture information regarding a non-contiguous set of wavelengths (e.g., a set of wavelengths that are not separated equidistantly).

As shown in FIG. 5B, a similar filter array 521 may utilize another non-equidistant channel spacing. For example, as shown by reference numbers 522 through 528, layer 522 may include a group of channels with a thickness of $15*t_4$, layer 524 may include a group of channels with a thickness of $4*t_4$, layer 526 may include a group of channels with a thickness of $2*t_4$, and layer 528 may include a group of channels with a thickness of $1*t_4$. As shown by reference number 530, a result of depositing layers 522, 524, 526, and 528 is a set of thicknesses for a set of channels that are not equidistant. For example, channel 531 is associated with a thickness of $2*t_4$, channel 532 is associated with a thickness of $6*t_4$, channel 533 is associated with a thickness of $21*t_4$, and channel 534 is associated with a thickness of $17*t_4$ (e.g., channels of thickness $8*t_4$ through $14*t_4$, inclusive, are omitted). A discontinuity between channel 532 and channel 533 permits a set of optical sensors associated with filter array 521 to capture information regarding two ranges of wavelengths separated by an amount of spectrum not equal to a separation between other channels of filter array 521.

As indicated above, FIGS. 5A and 5B are provided merely as an example. Other examples are possible and may differ from what was described with regard to FIGS. 5A and 5B.

Figure 6A:
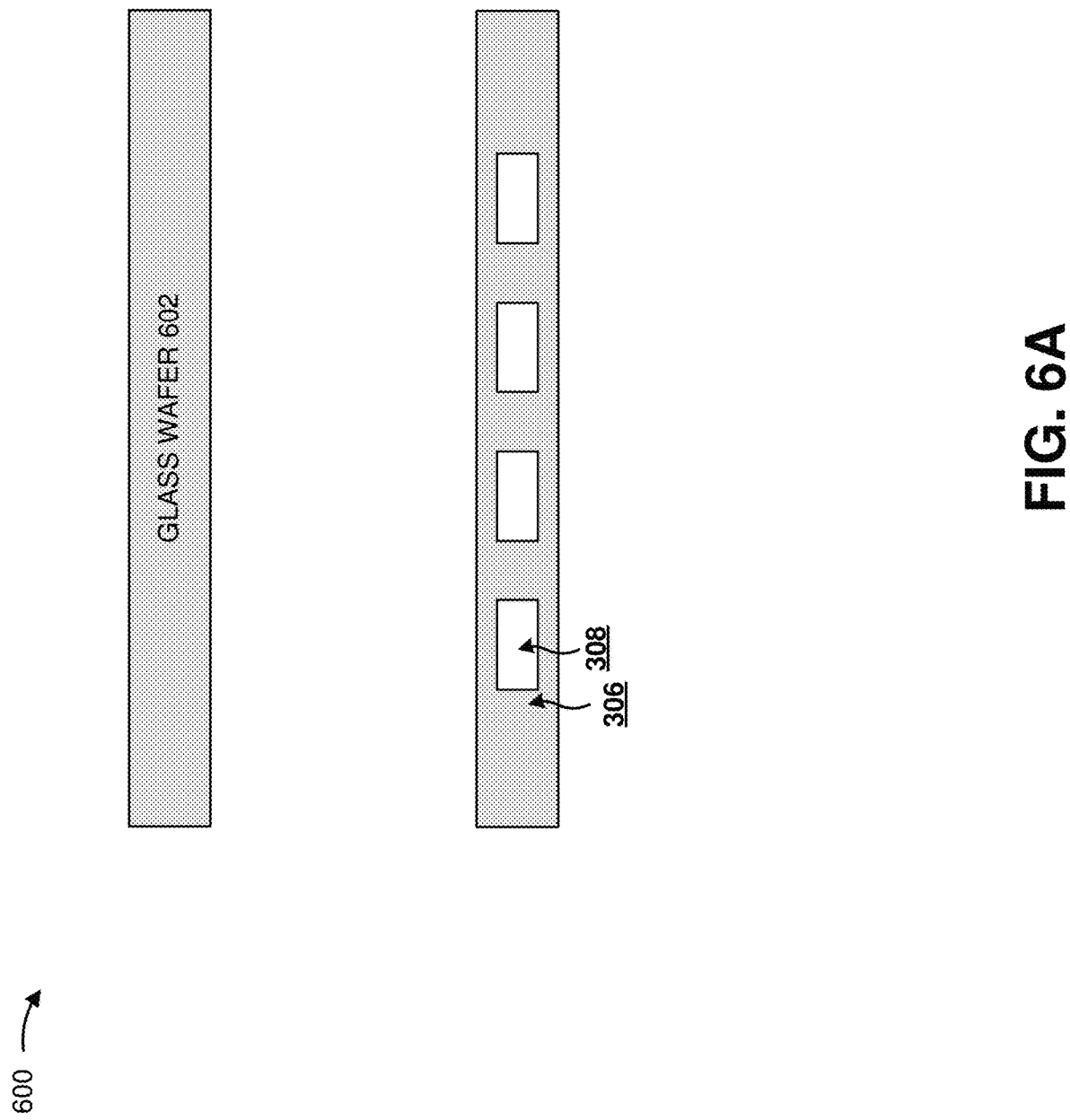
FIGS. 6A and 6B are diagrams of another example implementation relating to the example process shown in FIG. 2.
Figure 6B:
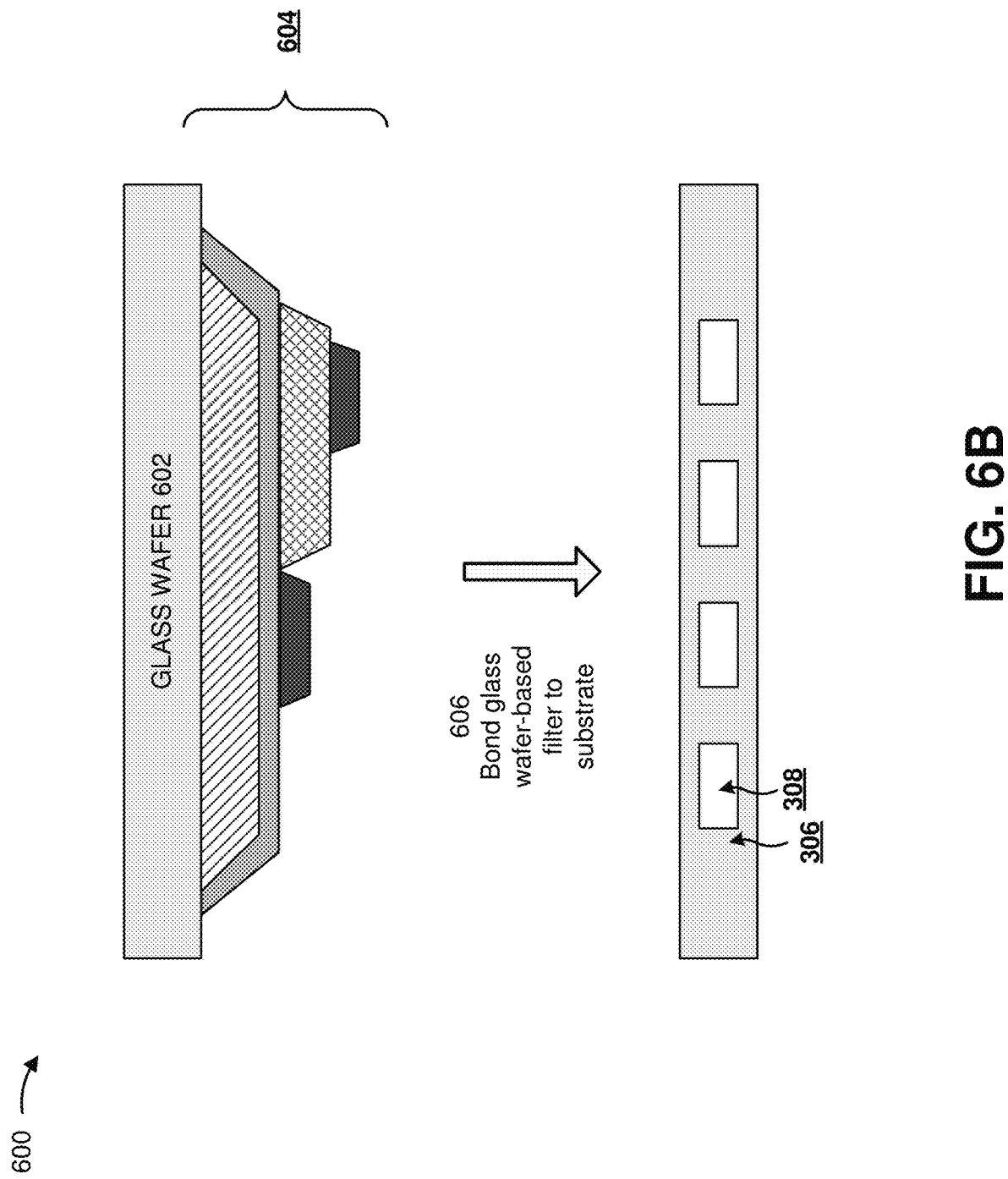

FIGS. 6A and 6B are diagrams of an example implementation 600 relating to example process 200 shown in FIG. 2.

As shown in FIG. 6A, sensor elements 308 may be disposed in substrate 306 during manufacture of an optical sensor device described herein. A glass wafer 602 may be provided, onto which a set of filter and spacer layers may be deposited, as described herein.

As shown in FIG. 6B, after depositing a set of layers 604 onto glass wafer 602, glass wafer 602 and layers 604 are bonded to substrate 306, as shown by reference number 606. In this way, layers can be formed on a separate substrate from sensor elements 308 and attached to sensor elements 308.

As indicated above, FIGS. 6A and 6B are provided merely as an example. Other examples are possible and may differ from what was described with regard to FIGS. 6A and 6B.

In this way, a multispectral filter array may be fabricated for an optical sensor device that is integrated onto a semiconductor substrate of the optical sensor device, that provides relatively low angle shift and relatively high spectral range, and that is environmentally durable relative to other filter structures, such as an LVF-type filter, a CVF-type filter, or the like.

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method of making an optical filter, comprising:
depositing a first mirror on a substrate;
depositing a first spacer layer on the first mirror;
depositing a second spacer layer on the first spacer layer, wherein the second spacer layer is deposited onto a subset of a surface of the first spacer layer; and
depositing a third spacer layer on the second spacer layer, wherein the third spacer layer is deposited onto a subset of a surface of the second spacer layer.

2. The method of claim 1, further comprising:
depositing a second mirror.

3. The method of claim 1, wherein the optical filter has at least sixteen subsections and each subsection has a different thickness.

4. The method of claim 1, wherein the first mirror includes dielectric material.

5. The method of claim 4, wherein the dielectric material includes hydrogenated silicon layers or silicon dioxide layers.

6. The method of claim 1, further comprising:
depositing a fourth spacer layer.

7. The method of claim 1, wherein the first spacer layer includes at least one of:
an oxide-based material,
a nitride-based material,
a germanium (Ge)-based material, or
a silicon (Si)-based material.

8. The method of claim 1, where the second spacer layer is deposited using a reactive magnetron sputtering process, a pulsed-magnetron sputtering process, an ion beam assisted deposition process, an ion beam sputtering process, a dual ion beam sputtering process, a reactive direct current sputtering process, an alternating current sputtering process, a radio frequency sputtering process, or an atomic layer deposition process.

9. A method of making an optical filter, comprising:
depositing a first mirror on a substrate;
depositing a first spacer layer on the first mirror;
depositing a second spacer layer on the first spacer layer, wherein a thickness of the second spacer layer is less than a thickness of the first spacer layer; and
depositing a third spacer layer on the second spacer layer, wherein a thickness of the third spacer layer is less than the thickness of the second spacer layer.

10. The method of claim 9, wherein the thickness of the second spacer layer is approximately half of the thickness of the first spacer layer.

11. The method of claim 9, further comprising:
depositing a second mirror.

12. The method of claim 9, wherein the optical filter has at least sixteen subsections and each subsection has a different thickness.

13. The method of claim 9, wherein the first mirror includes hydrogenated silicon layers or silicon dioxide layers.

14. The method of claim 9, further comprising:
depositing a fourth spacer layer.

15. The method of claim 9, wherein the first spacer layer includes at least one of:
an oxide-based material,
a nitride-based material,
a germanium (Ge)-based material, or
a silicon (Si)-based material.

16. The method of claim 9, where the second spacer layer is deposited using a reactive magnetron sputtering process, a pulsed-magnetron sputtering process, an ion beam assisted deposition process, an ion beam sputtering process, a dual ion beam sputtering process, a reactive direct current sputtering process, an alternating current sputtering process, a radio frequency sputtering process, or an atomic layer deposition process.

17. A method of making an optical sensor device, comprising:
depositing a first mirror on a substrate;
depositing four spacer layers on the first mirror,
wherein a first sum of thicknesses of the four spacer layers for a first channel is different from a second sum of thicknesses of the four spacer layers for a second channel,
wherein a third sum of thicknesses of the four spacer layers for a third channel is different from the first sum of thicknesses and the second sum of thicknesses,
wherein a fourth sum of thicknesses of the four spacer layers for a fourth channel is different from the first sum of thicknesses, the second sum of thicknesses, and the third sum of thicknesses, and
wherein a fifth sum of thicknesses of the four spacer layers for a fifth channel is different from the first sum of thicknesses, the second sum of thicknesses, the third sum of thicknesses, and the fourth sum of thicknesses; and
aligning the substrate with sensor elements.

18. The method of claim 17,
wherein the four spacer layers comprise a first layer and a second layer, and
wherein the second layer is deposited on the first layer.

19. The method of claim 17,
wherein the four spacer layers comprise a layer that includes a group of four or more channels associated with a thickness, and
wherein the thickness causes a particular wavelength of light to be directed toward a corresponding optical sensor of the sensor elements.

20. The method of claim 17,
wherein the four spacer layers comprise a layer,
wherein the layer includes sixteen channels that correspond to the sensor elements, and
wherein the sixteen channels include the first channel, the second channel, and the third channel.

* * * * *